United States Patent [19]

Nuver

[11] 4,204,141

[45] May 20, 1980

[54] ADJUSTABLE DC PULSE CIRCUIT FOR VARIATION OVER A PREDETERMINED RANGE USING TWO TIMER NETWORKS

[75] Inventor: Eric L. H. Nuver, San Marcos, Tex.

[73] Assignee: Esquire, Inc., New York, N.Y.

[21] Appl. No.: 941,157

[22] Filed: Sep. 11, 1978

[51] Int. Cl.² .......................................... H04B 39/02
[52] U.S. Cl. .................................. 315/311; 307/265; 307/269; 315/307
[58] Field of Search ............... 315/194, 199, 284, 287, 315/307, 311, DIG. 4, 291; 307/265, 269, 293, 252 B, 273, 266, 267

[56] References Cited

U.S. PATENT DOCUMENTS

| | | | |
|---|---|---|---|
| 3,467,838 | 9/1969 | Glazebrook et al. | 307/269 |
| 3,602,743 | 8/1971 | Shazo Jr. | 307/265 |
| 3,816,794 | 6/1974 | Snyder | 315/194 |
| 3,894,265 | 7/1975 | Holmes et al. | 315/DIG. 4 |
| 3,991,343 | 11/1976 | Delpy | 315/194 |

Primary Examiner—David K. Moore
Attorney, Agent, or Firm—Frank S. Vaden, III

[57] ABSTRACT

A circuit for providing a dc pulse, such as to a gated semiconductor for at least partial bypass of a ballast element connected to an HID lamp, the pulse being developed within a time range of an associated ac voltage. A first timer operably connected to the ac voltage produces a first dc output pulse and a second timer connected to the output of the first timer produces the circuit dc pulse output. Reduction of a threshold control voltage of the first timer permits a time constant network connected thereto to advance the conclusion of the output of the first timer forward within its operational range. A time constant network connected to the second timer has charge current added to it from the first timer control voltage, the amount of such current decreasing with an advance positioning of the output of the first timer, thereby increasing the slope of the charge-up voltage of the second time constant network and shortening of the related square wave or dc pulse output from the second timer.

18 Claims, 6 Drawing Figures

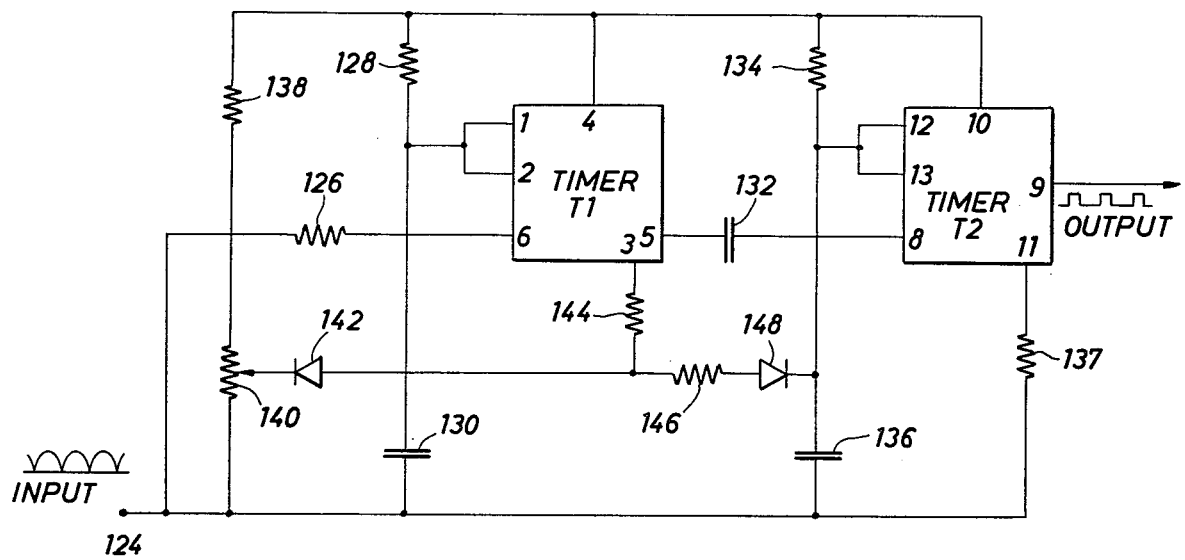
FIG. 3
FIG. 2
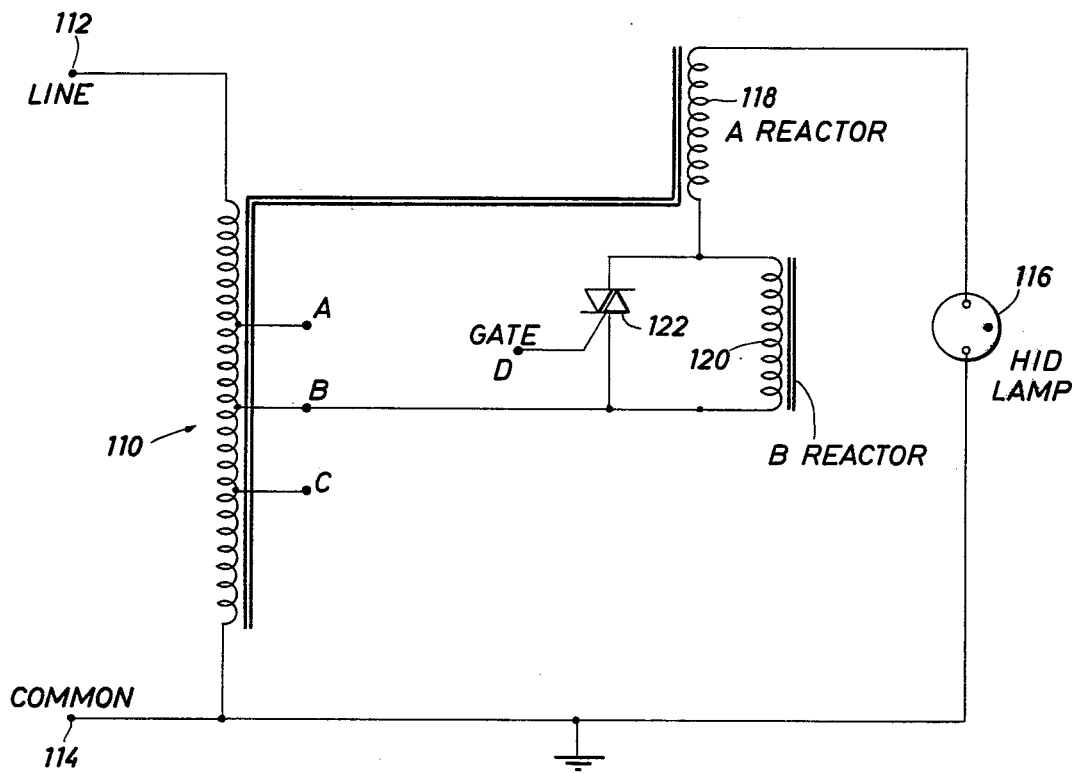

ADJUSTABLE DC PULSE CIRCUIT FOR VARIATION OVER A PREDETERMINED RANGE USING TWO TIMER NETWORKS

BACKGROUND OF THE INVENTION

1. Field of the Invention

This invention pertains to dimmer circuits for high intensity, gaseous discharge (HID) lamps and more particularly to such a dimmer that provides dimming current to the lamp through at least partial bypass of a reactive ballast as determined by the positioning of unipolar dc pulses applied during a permissible time range of applied line voltage.

2. Description of the Prior Art

U.S. Pat. No. 3,816,794, Snyder, describes a circuit employing a two-part reactive ballast connected in series with a high intensity, gaseous discharge lamp. One of the two elements of the ballast is connected across the main terminals of a triac operating as a gated bypass means. When the triac conducts, a current path is established through the triac, at least partially bypassing the reactive element. The duration of conduction determines the total amount of current through the ballast, and hence through the lamp, thereby providing a means for establishing the brightness of the lamp.

In the circuit described in U.S. Pat. No. 3,816,794, low gate source or drive voltage to the gate of the gated bypass triac is derived from a potentiometer, an isolating transformer circuit, a second triac and a Zener diode network, together with other components. The gated bypass triac is fired from a gate source in phase with line voltage, the amplitude being controlled by a gate-signal control device including a Zener diode to properly time the turning on of the triac in relation to lamp current. The Zener diode also prevents the triac from being triggered past a time when there might be opposite polarity ballast-element voltage and lamp current, which would cause flicker of the lamp.

U.S. Pat. No. 3,894,265 discloses a circuit that provides a control network for the gated bypass network including the programmable unijunction transistor. Ready connection to single power and three-phase power systems is achieved, but the gating of the bypass triac is by ac gating.

Variations in controlling the timing operations to a gated semiconductor connected for at least partial current bypass operation of a ballast connected to an HID lamp are shown in the following patent applications: patent application Ser. No. 927,555, "Optocoupler Dimmer Circuit for High Intensity Gaseous Discharge Lamp", filed July 24, 1978; patent application Ser. No. 930,913, "High Frequency Dimmer Circuit for High Intensity Gaseous Discharge Lamp Dimmer", filed Aug. 4, 1978; patent application Ser. No. 936,883, "Non-Interfering, Overlapping High Frequency Signalling for Lamp Dimming Circuit", filed Aug. 25, 1978; and patent application Ser. No. 936,882, "Variable Low Frequency Dimming for High Intensity Gaseous Discharge Lamps", filed Aug. 25, 1978, all of the same inventor as the present application.

Although there are many schemes of gating and developing gating signals, none show the use of twin timers for developing a readily movable and variable width dc pulse for gating within a time range of ac line voltage.

It is therefore a feature of the present invention to provide an improved dimmer having these desirable features and further to provide an improved pulsing circuit whose width is dependent on the forward advancement within a time range of an associated ac voltage.

SUMMARY OF THE INVENTION

The present invention employs a timer circuit having a time constant network connected thereto an operably triggered from a voltage derived from and in phase with the line voltage. The trigger voltage starts the timing sequence, causing the output to go to its high voltage state. The time constant network and a threshold voltage setting determine the width of the dc output pulse. By lowering the threshold voltage level of the timer, the time constant network causes the timing conclusion of the dc output pulse to advance.

A second timer triggered from the trailing edge of the output of the first timer operates in similar fashion.

The effective width of the output pulse from the second timer is varied by adding control current to the time constant network of the second timer when the trailing edge of the first timer is operating later in the range and gradually removing such control current when the trailing edge of the first timer is operating near the beginning of its range, thereby causing the desirable pulse width variations with advance or forward movement of the pulse from the second timer.

BRIEF DESCRIPTION OF THE DRAWINGS

So that the manner in which the above-recited features, advantages and objects of the invention, as well as others which will become apparent, are attained and can be understood in detail, more particular description of the invention briefly summarized above may be had by reference to the embodiment thereof which is illustrated in the appended drawings, which drawings form a part of this specification. It is noted, however, that the appended drawings illustrate only a typical embodiment of the invention and are therefore not to be considered limiting of its scope, for the invention may admit to other equally effective embodiments.

In the Drawings:

FIG. 2 is a simplified schematic diagram of a basic current bypass circuit for dimming an HID lamp employing a high reactance autotransformer connected to a gated semiconductor.

FIG. 3 is a simplified schematic diagram of a preferred embodiment of the present invention.

DESCRIPTION OF THE PREFERRED EMBODIMENT

The invention described herein is an improvement of the dimming circuit described in U.S. Pat. No. 3,894,265, commonly assigned, and which is incorporated herein by reference for all purposes.

Figure 1:
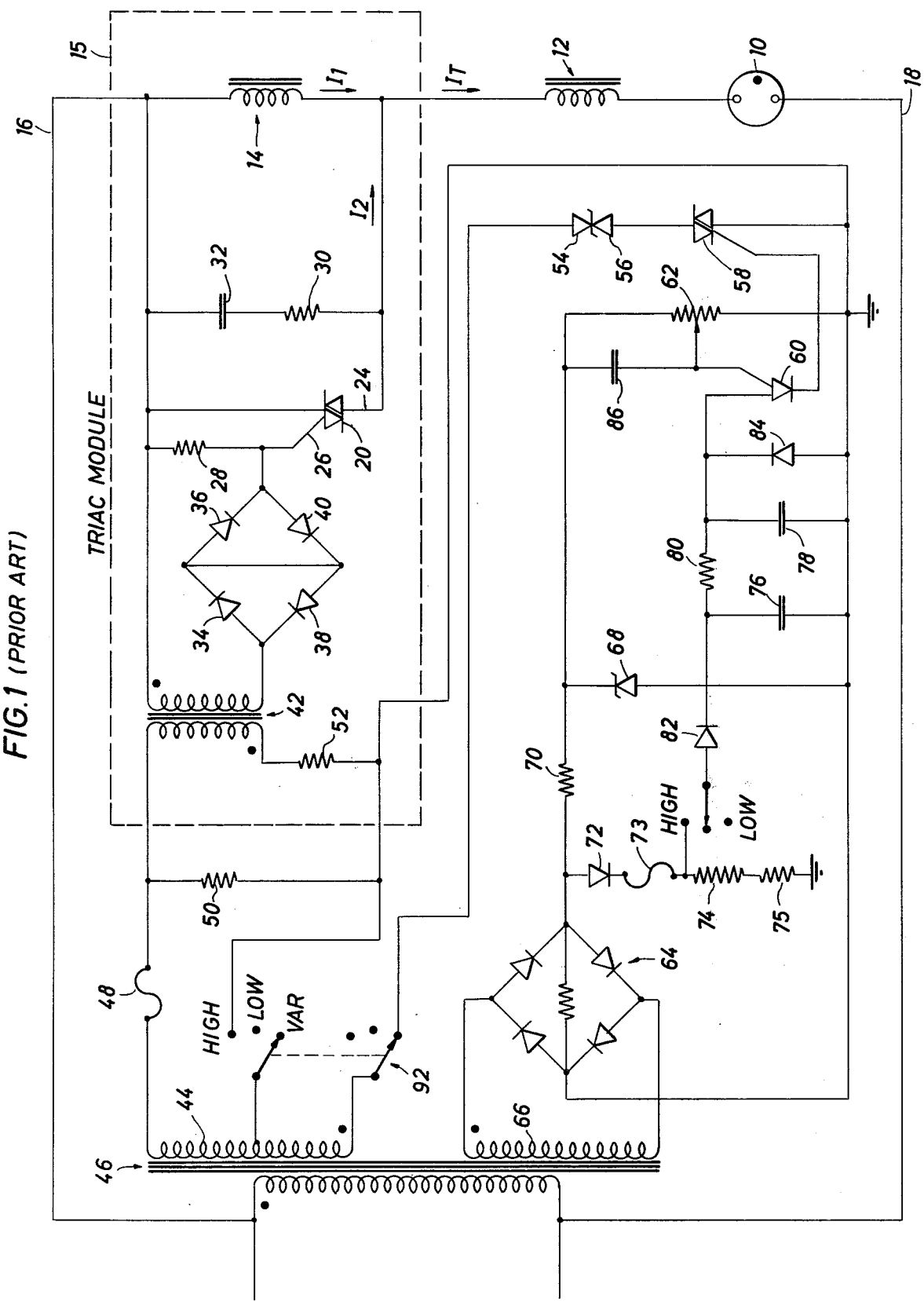
FIG. 1 is a schematic diagram of the prior art dimming circuit employing a gated semiconductor for at least partially bypassing an inductive ballast element. The embodiment of the present invention achieves bypassing in a similar but different fashion.

Now referring to the drawings and first to FIG. 1, which is also FIG. 1 of U.S. Pat. No. 3,894,265, high intensity discharge lamp 10 is connected in series with two inductive ballast elements 12 and 14, the entire combination being connected between lines 16 and 18. Gated bypass means in the form of triac 20 is connected across element 14, first main terminal 22 of the triac being connected to line 16 and second main terminal 24 being connected to a junction between the two elements. Of course, triac 20 can be a different type of gated semiconductor, if desired. Gate terminal 26 is connected to shunt resistor 28, which is also connected to line 16. Resistor 30 and capacitor 32, connected in series with each other and in parallel with element 14, are provided as a snubber device to provide triac 20 immunity from communutating dv/dt false turn on. Two pairs of diodes 34 and 36 and 38 and 40 connected to gate 26 provide the gate source voltage to triac 20 from transformer 42. These diodes are connected so that two diodes 34 and 36 face forward and two diodes 38 and 40 face backwards, with the junction point between each pair being connected together. Diodes 34, 36, 38 and 40 provide a slight forward voltage drop to block out the residual magnetizing force from transformer 42 and to thereby prevent false firing of triac 20. Everything between and including transformer 42 and its accompanying load resistor 52, and inductor 14 may be considered to be in "triac module" 15.

When triac 20 is conducting to form a complete bypass around element 14, a maximum amount of current flows through lamp 10. On the other hand, when triac 20 is not conducting then the minimum amount of current flows through lamp 10. By allowing triac 20 to conduct for part of the cycle, then the current through lamp 10, and hence the illumination therefrom, can be varied between the dim lamp current and full lamp current values. It is apparent, therefore, that merely controlling the period of conduction of triac 20 will achieve controllable illumination of lamp 10. A fuller explanation of the relationship of the phasing of the currents and voltages pertaining to the operation of the FIG. 1 circuit is given in U.S. Pat. No. 3,894,265.

Control of the conduction of triac 20 is accomplished by the controllable gate voltage means connected to transformer 42. To understand the operation of the control circuit, some additional phase relationships have to be appreciated. The voltage across element 14 (reactor voltage) is leading the lamp current by approximately 85° and also is leading the line voltage by approximately 30°.

In this prior art circuit, triac 20 should not be rendered conductive until current through and the voltage across element 14 are both of the same polarity, either both positive or both negative. If triac 20 was rendered conductive when the voltage across element 14 and the current therethrough were not of the same polarity, a phenomenon known as "half cycle conduction" would occur. The lamp would appear to flash from dim to full bright each half cycle and would produce an irritating strobing effect to the eye that would also be harmful to the lamp.

Power is applied to transformer 42 via the secondary 44 of power transformer 46 whose primary is connected across lines 16 and 18. One terminal of secondary 44 is connected to fuse or circuit breaker 48. Load resistors 50 and 52 connected to the two sides of the primary of transformer 42 are connected to ground. The power connection from the secondary 44 of transformer 46 to the primary of transformer 42 is through a bidirectional voltage regulating means in the form of cathode-to-cathode Zener diodes 54 and 56 and triac 58. It is well known that alternatively Zener diodes 54 and 56 may be connected anode-to-anode and operate in the same manner.

It is well known that the gate pulse to a triac controlling an inductive load is desirably a continuously applied gate voltage, having at least an appreciable duration, rather than an instantaneous pulse. Again referring to FIG. 1, it may be seen that cathode-to-cathode Zener diodes 54 and 56 are connected in series with the main terminals of triac 58, the entire combination being connected as previously mentioned in series with secondary 44 of transformer 46. It is readily apparent that the gate voltage has for its source from secondary 44 a voltage which is in phase with the voltage across lines 16 and 18, a voltage which may be referred to as the "gate source voltage". It is, of course, in phase with the line voltage across lines 16 and 18.

Connected to the gate terminal of triac 58 is the cathode of programmable unijunction transistor 60. The gate connection to PUT 60 is connected to a rectified dc voltage via variable resistor 62. The timing of the conduction of PUT 60 is determined by the voltage differential between the voltage applied via resistor 62 and the voltage applied to the anode of PUT 60. Both the voltage applied to the anode and to the gate of PUT 60 are important to its conduction. The anode voltage must be slightly larger than the gate voltage to cause conduction. That is, conduction is dependent on the arithmetic difference between the voltage applied to the anode and gate. Therefore, the setting of resistor 62 "programs" what anode voltage is required to produce conduction. The dc voltage applied to resistor 62 is developed by bridge rectifier 64 connected to secondary 66 of transformer 46. A Zener diode 68 and current limiting resistor 70 insures that the voltage applied to resistor 62 never exceeds a predetermined value.

The output from bridge rectifier 64 is also connected through diode 72, fuse 73 and variable resistor 74 to a time constant control network connected to the anode of PUT 60. This time constant network includes capacitors 76 and 78 and resistor 80. A diode 82 is included in series with the voltage from resistor 74.

A diode 84 in the anode circuit of PUT 60 and capacitor 86 in the gate circuit of PUT 60 insure positive reset of PUT 60 following conduction. It should be noted that the operating adjustment for PUT 60 is determined by variable resistor 62. The ultimate control for determining the amount of brightness of lamp 10 is determined by the setting of resistor 74. As PUT 60 ages, the setting of resistor 62 can be changed, as well as permitting an easy setting for initial conditions.

In operation, programmable unijunction PUT 60 is turned on by the voltage difference between the voltage on the anode of PUT 60 (voltage on capacitor 78) and the voltage on the movable contact of resistor 62. On each cycle of ac voltage applied to the bridge, there is a rise to a dc level at the output of this bridge for application to the gate of PUT 60 through resistor 62. In a more sluggish fashion, a voltage determined by the setting of resistor 74 is applied to the anode of PUT 60. When the differential in these two voltages is reduced at the gate and anode of PUT 60 to the point of causing conduction, a gate voltage is supplied to triac 58. Triac 58 conducts when the secondary voltage of 44 applied thereto exceeds the Zener diode voltage of diodes 54 and 56. When diodes 54 and 56 conduct, there is a complete circuit in secondary winding 44 of transformer 46. This permits voltage to be supplied to transformer 42.

Yet another method of achieving the desired timing of PUT 60 to achieve firing within the desired gate range, even without Zener diodes 54 and 56, can be accomplished by selecting the components of resistor 74, resistor 75, which is connected between resistor 74 and ground, resistor 80, capacitor 78, the voltage determined by Zener diode 68, and the setting of the voltage on the gate of PUT 60 by the setting of the voltage on the gate of PUT 60 by the setting of the movable arm on resistor 62. The setting is determined by placing variable resistance 74 at its lowest or dim setting.

The operation of the part of the FIG. 1 circuit not in triac module 15 may be better understood by reference to the description of the circuit which is more fully set out in U.S. Pat. No. 3,894,265.

Now referring to FIG. 2, components of a basic circuit are shown with which a dimming circuit is connected for operation. Operationally, the circuit shown in FIG. 2 functions in similar fashion to that described in FIG. 1. A high reactance autotransformer (HRAT) 110 receiving power from a nominal 120-volt ac source at line terminal 112 and common or ground terminal 114 supplies power to HID lamp 116 and ballasting via A reactor portion 118 and B reactor portion 120. The A reactor portion is loosely magnetically coupled to the primary of the transformer in conventional fashion.

Triac 122 is connected so that its main terminals are connected across B reactor 120 for current bypass operation in the manner described in FIG. 1 to provide dimming control for HID lamp 116. The signal applied to the gate of triac 122 determines the conduction timing of the triac. It should be noted that the primary of HRAT 110 is conveniently tapped at terminals A and C on either side of center tap B to provide a source of low voltage ac to the dimming circuit described below, which voltage is in phase with the line voltage. These taps are at a nominal +18 volts and −18 volts. Gate terminal D provides a gate connection from the dimming circuit and terminal B is connected to B reactor portion 120.

In order to understand the operation of the circuits described hereinafter it is first necessary to understand timer circuits T1 and T2.

Timer circuits T1 and T2 are substantially identical and are illustrated as being the two timers of a standard Model 556 timer produced by many manufacturers. Alternatively, they could each be a standard Model 555 timer, also produced by many manufacturers, or be timers comprising discrete components to function in the manner hereafter described.

In operation, a trigger input is applied to pin 6 of timer T1 (pin 8 of timer T2) when the voltage thereto drops below a predetermined voltage level. Alternate trigger sources include a decaying positive signal approaching zero as well as a negative-going signal. Output pin 5 of timer T1 (pin 9 of timer T2) produces a positive-going leading edge of a square wave with the occurrence of a trigger at pin 6 (or pin 8).

An external time constant network determines when the negative-going trailing edge of the output square wave occurs in conjunction with a control voltage on pin 3 (or pin 11). This control voltage, without external components connected thereto, is nominally set at two-thirds the voltage applied to pin 4 (or pin 10). Internally, the control voltage determines the voltage level to a comparator and hence, the threshold level at pin 2 (or pin 13) needed to actuate the comparator. Actuation of the comparator applies a base voltage to an internal npn transistor, causing discharge of pin 1 (or pin 12) therethrough to the common connection. This action also causes the negative-going trailing edge of the square wave output to occur. It may be seen that when the external time constant network is connected to both pins 1 and 2 (or pins 12 and 13) then the build up to threshold level both actuates the timing conclusion event of the timer as well as dischargeably resetting the time constant network for the next timing initiating event. When the next trigger signal input occurs, base voltage is removed from the internal transistor to again permit the build-up of timing voltage across the time constant network to occur.

Figure 4:
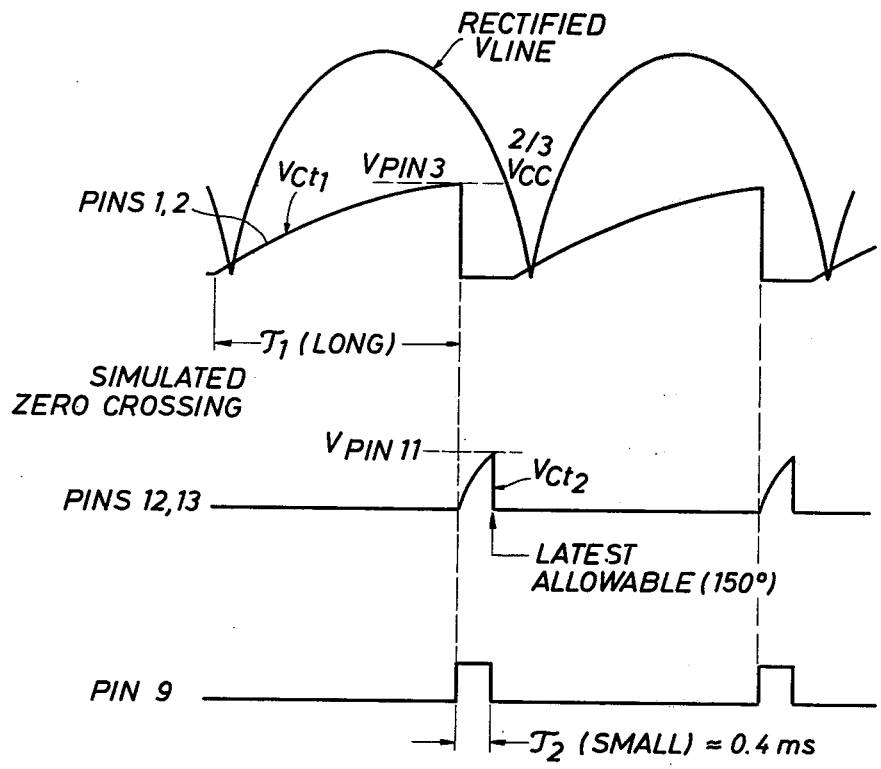
FIG. 4 is a waveform diagram of the preferred embodiment of the invention shown in FIG. 3 operating in its "dim" operation mode.

Now referring to FIGS. 3 and 4, one operating mode of the circuit is illustrated in terms of a simplified preferred embodiment of the present invention dimming circuit and the related wave diagrams, which also illustrates the pin connections of timers T1 and T2.

The waveform marked "rectified $V_{line}$" is a nominal 25 volts peak in phase with the line voltage and determines the timing sequence for circuit operation. This is the voltage waveform applied via terminal 124 and resistor 126 to pin 6 of timer T1. As mentioned above, when the level reduces below a certain predetermined level (just before the zero crossing), the timer is "triggered" to produce a positive-going, leading edge of a square wave output on pin 5 and to remove a discharge connection from a time constant network comprising resistor 128 and capacitor 130 connected to pin 1 and pin 2.

As shown in FIG. 4, the build up of voltage $V_{ct1}$ on the time constant network is started and goes up exponentially until it reaches a predetermined threshold level established by the control voltage on pin 3. Without any external connections to pin 3 to change the level, the timer is set so that this threshold is at two-thirds the voltage level of the bias voltage applied to the timer. As noted in the diagram, this level is indicated as "$\frac{2}{3} V_{cc}$".

When the threshold level is reached, there is a production of the negative-going trailing edge of the square wave output from pin 5 and the reestablishment of the discharge connection to pin 1 to return the voltage on pins 1 and 2 to zero until the sequence starts again.

The negative-going trailing edge of the pin 5 output from timer T1 is applied as the input to pin 8 of timer T2 via capacitor 132 of a differentiating network (not shown), which has the effect of producing the leading edge of the square-wave output on pin 9 and removing the discharge connection from the time constant network comprising resistor 134 and capacitor 136 connected to pins 12 and 13 of timer T2. The time constant of these components is shorter than the time constant of resistor 128 and capacitor 130. As more fully explained hereinbelow, there are other components connected to capacitor 136 for affecting the time constant operation of the network connected to pin 13. Resistor 137 provides the setting of the control voltage on pin 11.

Figure 5:
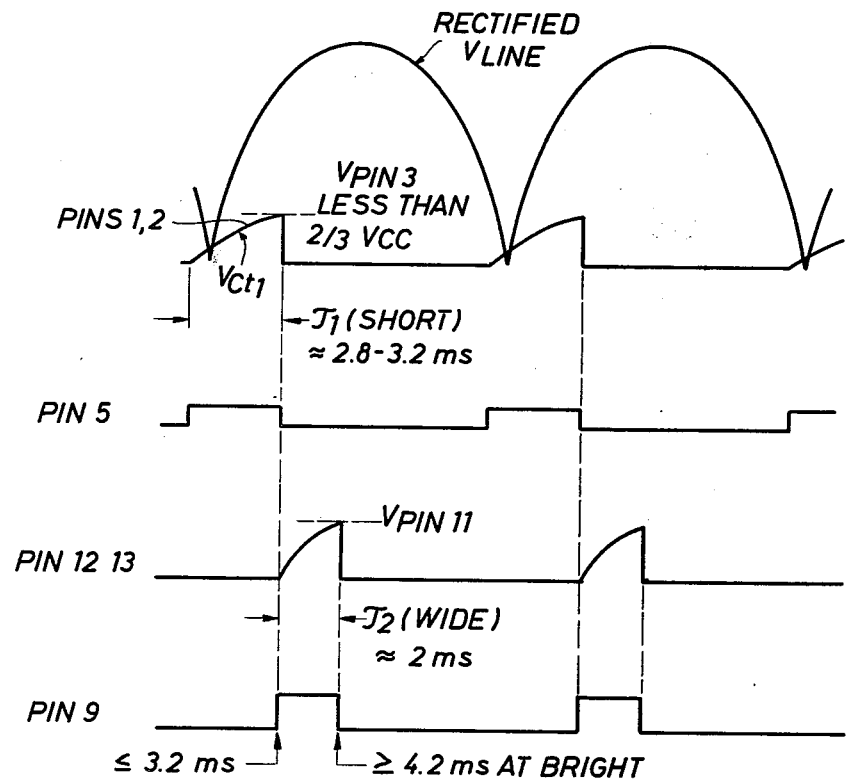
FIG. 5 is a waveform diagram of the preferred embodiment of the invention shown in FIG. 3 operating in its "bright" operation mode.

In the embodiment shown in FIG. 3, the adjustment of the phase location of the trailing edge of the waveform at pins 1 and 2 is accomplished by reducing the threshold level on pin 3 and, hence, the level required for activating the internal comparator of timer T1. The slope of the time constant curve remains the same. This reduction in threshold is illustrated in FIGS. 4 and 5, with the attendant movement forward of the trailing edge of the waveform on pins 1 and 2. To accomplish this operation, a voltage divider comprising resistors 138 and 140 is connected across the internal resistors between terminals 4 and 7 of timer T1. "Control voltage" pin 3 is connected via resistor 144 and diode 142 to the wiper of resistor 140, the intensity control. The setting of the wiper of variable "intensity" resistor 140 determines the threshold setting as described above and diode 142 provides desirable isolation and does not conduct beyond a certain dim setting.

For reasons more fully explained hereinafter, it is desirable to have a wider output pulse with forward phase movement of this pulse. As noted in FIG. 5, the slope of the curve on pins 12 and 13 is more gradual than the slope of the curve on pins 12 and 13 in the FIG. 4 operating mode. This variable operation is caused by the variation of the setting of the control voltage on pin 3 applied to capacitor 136 via resistor 144 (i.e., 144a and 144b), resistor 146 and diode 148. Diode 148 provides isolation of capacitor 136 during a low voltage setting of resistor 140. The higher the voltage and the longer the duration of voltage application to capacitor 136, to add to the voltage build up via resistor 134, the quicker the voltage reaches the threshold operating level. Therefore, when the control voltage on pin 3 is at its highest level (wiper of resistor 140 at the top) then the slope of $V_{ct2}$ is at its maximum (FIG. 4) and when the control voltage on pin 3 is at its lowest level (wiper 140 at the bottom) then the slope of $V_{ct2}$ is at its minimum (FIG. 5).

The time that it takes the time constant network to reach the threshold set by the control voltage of timer T2 determines the duration of the square wave output on pin 9.

The nominal values shown in the FIG. 4 operation mode (dim operation) show that the timing of timer T1 is long and that the pulse establishment for pin 9 is close to 150° point of the operating 180° half cycle of the rectified line voltage and the duration of the output pulse is approximately 0.4 milliseconds.

The nominal values shown in the FIG. 5 operation mode (bright operation) show that the timing of timer T1 is relatively short (approximately between 2.8 and 3.2 milliseconds) and that the pulse established on pin 9 is relatively wide (approximately 1-2 milliseconds).

Timer T2 develops a relatively small pulse width (approximately 0.4 milliseconds) when the circuit is in dim operation. This is sufficiently wide to allow triac 122 to latch on under its inductive load. The exact phase angle of operation of triac 122 when the circuit is operating at the full bright setting is a little more complex than the simplified waveforms shown in FIGS. 4 and 5 and is dependent on lamp impedance. With a starting lamp the gating pulse needs to be close to 4.2 milliseconds long or else the triac is in danger of self-commutation by the current therethrough going through zero with this type of inductive load. Even with a warm lamp under full bright operation the triac needs to be driven close to 3.2 milliseconds. Hence, it is desirable to have a relatively wide gate pulse for full bright operation. On the other hand, minimal pulse width towards dim operation is all that is required. Moreover, to provide the full dimming range required, it is desirable that the gating pulse be narrow for dim operation.

Figure 6:
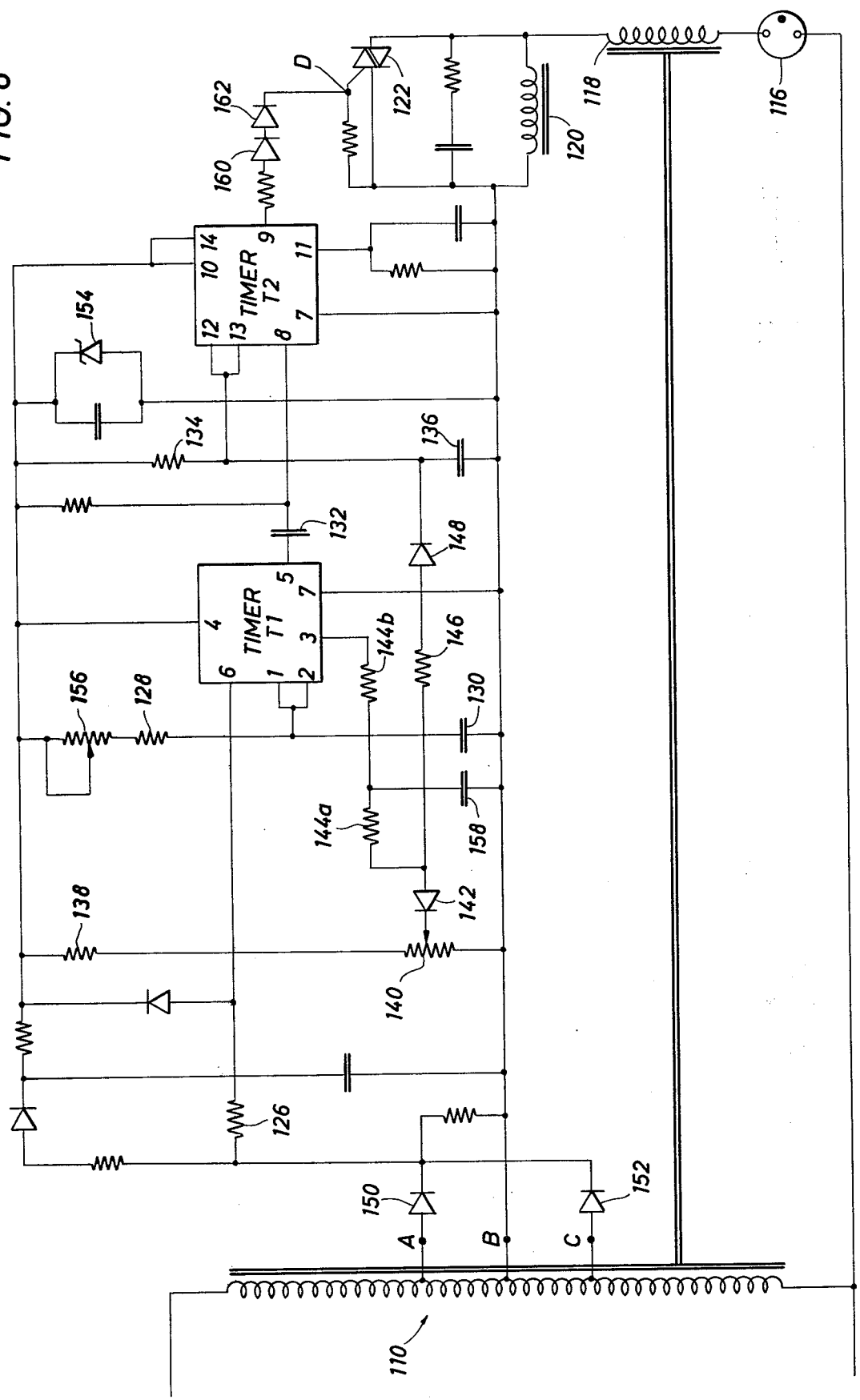
FIG. 6 is a schematic diagram of a preferred embodiment of the present invention connected for lamp dimming control of an HID lamp, the lamp being connected to a high reactance autotransformer (HRAT), the HRAT connected to a gated semiconductor for at least partial current bypass operation.

FIG. 6 illustrates a full schematic of a circuit operating in the manner described for the simplified circuit shown in FIG. 3, like components being similarly numbered. Also shown are the connections made to the basic HRAT current bypass circuit shown in FIG. 2, again like components being identified with like numbers.

Note that, in addition to the components described above, diodes 150 and 152 connected to terminals A and C respectively, of the primary of HRAI 110, perform the full wave rectification of the voltage applied to the circuit in phase with the line voltage. Alternatively, a small winding and a bridge rectifier could be used.

Zener diode 154 and its related capacitor establish the $V_{cc}$ bias voltage for the timers. Variable resistor 156 in series with resistor 128 provide a means for varying the time constant of the circuit connected to timer T1 for calibration purposes.

Typical values of the critical components that have been successfully employed are as follows:
Resistor 144 = 3.3 K ohms
Resistor 146 = 100 K ohms
Resistor 128 = 65 K ohms
Resistor 134 = 1 M ohms
Resistor 137 = 1.5 K ohms
Capacitor 130 = 0.1 microfarads
Capacitor 136 = 10 nanofarads
Resistor 140 = 10 K ohms
Resistor 137 is the resistor connected to pin 11.

This circuit produces very good operation and good triggering of triac 122 in its operation range as follows:

|  | Pulse Position | Pulse Width |
|---|---|---|
| dim | timer $\tau_1$ = 6.6 msec | $\tau_2$ = 0.4 msec |
| medium | = 4.2 msec | = 0.8 msec |
| bright | = 2.8 msec | = 2.1 msec |

In the final circuit of FIG. 6, resistor 144 was split into two resistors 144a and 144b and 50 microfarad capacitor 158 was connected from a point therebetween to circuit common to slow down an instant change in the position or rotation of potentiometer resistor 140.

Note further that with the values given above, when in dim operation, the trailing edge of the triac gate trigger pulse does not occur later than $\tau_1 + \tau_2 = 6.6 + 0.4$ milliseconds (or approximately 150°). The exact point is adjustable by a resistance adjustment of trimmer resistor 156.

Note also that the direction of gate current from output pin 9 into the gate of triac 122 is always positive, but gate voltage can go negative after triggering when operating triac 122 in quadrant IV of the line voltage. Diodes 160 and 162 are included to prevent reverse conduction of the transistor internal in the output stage of timer T2 (connected to pin 9) and to form a two-diode threshold device for gating the triac 122 after time $\tau_2$.

The remainder of the circuit includes several buffer capacitors for filtering, diodes for stabilization and the snubber network across triac 122 to limit dV/dt.

Although a preferred embodiment with a minimum number of components has been described and illustrated for desirably varying the output pulse width with the advance phase positioning thereof, alternate circuits for accomplishing this operational characteristics are within the scope of the invention described herein.

For example, a transistor connected to control voltage pin 11 of timer T2 can be used to invert the action of pin 3 of timer T1. Such a transistor can be either driven by the control voltage on pin 3 or pin 3 can be connected through an inverting transistor to an intensity potentiometer, like resistor 140, and pin 11 connected directly thereto. Further alternate connections include connecting the time constant network connected to timer T2 to receive voltage charge addition from the time constant network of time T1 through a diode in a manner similar to that shown in FIG. 6 and connecting the control voltage connection pin 11 of timer T2 to the applied rectified voltage via a diode.

Therefore, while a particular embodiment of the invention has been shown and described, it will be understood that the invention is not limited thereto, since many modifications may be made and will become apparent to those skilled in the art.

What is claimed is:

1. In a dimming circuit for a high intensity discharge lamp comprising
   a reactive ballast including a first portion and a second portion, each in series with the lamp, said first portion connectable for at least partial current bypass to cause lamp dimming,
   a gated semiconductor having its main terminals connected across said first reactive ballast portion,
the improvement in a gating circuit connectable to the gate of said gated semiconductor for providing a positionable unipolar dc pulse thereto within a time range of one-half of the line voltage applied to the lamp, said improvement comprising
   a rectifier operably connectable to ac line voltage for producing rectified line voltage,
   first timer means having a trigger input actionable when a voltage applied thereto is below a predetermined level for producing a dc pulse output, the duration of which is determined by the length of time that the voltage across a time constant network, discharged prior to application of the trigger input, builds to a predetermined control voltage level, said control voltage internally determining the level at which a threshold input actuates the timing conclusion event of said first timer means,
   said first timer trigger input being operably connected to said rectified line voltage,
   a first time constant network connected to the threshold input of said first timer means,
   second timer means having a trigger input actionable when a voltage applied thereto is below a predetermined level for producing a dc pulse output, the duration of which is determined by the length of time that the voltage across a time constant network, discharged prior to application of the trigger input, builds to a predetermined control voltage level, said control voltage internally determining the level at which a threshold input actuates the timing conclusion event of said second timing means,
   said second timer input operably connected to the dc pulse output of said first timer,
   the output of said second timer being connected to the gate of the gated semiconductor,
   a second time constant network being connected to the threshold input of said second timer means, and
   variable voltage means connected to change the control voltage level of said first timer means, a change of said first timer control voltage level causing a narrowing of first timer pulse output, and advancement of the dc pulse output of said second timer.

2. The improvement in a gating circuit in accordance with claim 1, wherein the lowering of said first timer control voltage causes a narrowing of said first timer pulse output.

3. In a dimming circuit for a high intensity discharge lamp comprising
   a reactive ballast including a first portion and a second portion, each in series with the lamp, said first portion connectable for at least partial current bypass to cause lamp dimming,
   a gated semiconductor having its main terminals connected across said first reactive ballast portion,
the improvement in a gating circuit connectable to the gate of said gated semiconductor for providing a positionable unipolar dc pulse thereto within a time range of one-half of the line voltage applied to the lamp, the width of said pulse varying from its widest duration when said pulse is positioned to occur near the beginning of the time range to its narrowest duration when said pulse is positioned to occur near the end of the time range, said improvement comprising
   a rectifier operably connectable to ac line voltage for producing rectified line voltage,
   first timer means having a trigger input actionable when a voltage applied thereto is below a predetermined level for producing a dc pulse output, the duration of which is determined by the length of time that the voltage across a time constant network, discharged prior to application of the trigger input, builds to a predetermined control voltage level, said control voltage internally determining the level at which a threshold input actuates the timing conclusion event of said first timer means,
   said first timer trigger input being operably connected to said rectified line voltage,
   a first time constant network connected to the threshold input of said first timer means,
   second timer means having a trigger input actionable when a voltage applied thereto is below a predetermined level for producing a dc pulse output, the duration of which is determined by the length of time that the voltage across a time constant network, discharged prior to application of the trigger input, builds to a predetermined control voltage level, said control voltage internally determining the level at which a threshold input actuates the timing conclusion event of said second timing means,
   said second timer input operably connected to the dc pulse output of said first timer, the output of said second timer being connected to the gate of the gated semiconductor,
   a second time constant network being connected to the threshold input of said second timer means,
   variable voltage means connected to change the control voltage level of said first timer means, a change of said first timer control voltage level causing a narrowing of first timer pulse width output, and
   means connected to said variable voltage means and to said second timer means for causing the timing conclusion event to occur so as to widen the output from said second timer means with advancement of the occurrence of the trailing edge of said dc pulse output of said first timer.

4. In a dimming circuit for a high intensity discharge lamp comprising
  a reactive ballast including a first portion and a second portion, each in series with the lamp, said first portion connectable for at least partial current bypass to cause lamp dimming,
  a gated semiconductor having its main terminals connected across said first reactive ballast portion,
the improvement in a gating circuit connectable to the gate of said gated semiconductor for providing a positionable unipolar dc pulse thereto within a time range of one-half of the line voltage applied to the lamp, the width of said pulse varying from its widest duration when said pulse is positioned to occur near the beginning of the time range to its narrowest duration when said pulse is positioned to occur near the end of the time range, said improvement comprising
  a rectifier operably connectable to ac line voltage for producing a rectified line voltage,
  first timer means having a trigger input actionable when a voltage applied thereto is below a predetermined level for producing a dc pulse output, the duration of which is determined by the length of time that the voltage across a time constant network, discharged prior to application of the trigger input, builds to a predetermined control voltage level, said control voltage internally determining the level at which a threshold input actuates the timing conclusion event of said first timer means, said first timer trigger input being operably connected to said rectified line voltage,
  a first time constant network connected to the threshold input of said first timer means,
  second timer means having a trigger input actionable when a voltage applied thereto is below a predetermined level for producing a dc pulse output, the duration of which is determined by the length of time that the voltage across a time constant network, discharged prior to application of the trigger input, builds up to a predetermined control voltage level, said control voltage internally determining the level at which a threshold input actuates the timing conclusion event of said second timing means,
  said second timer input operably connected to the dc pulse output of said first timer, the output of said second timer being connected to the gate of the gated semiconductor,
  a second time constant network being connected to the threshold input of said second timer means,
  variable voltage means connected to change the control voltage level of said first timer means, a change of said first timer control voltage level causing a narrowing of first timer pulse width output, and
  a diode and resistor connected to said variable voltage means and said second time constant network, a voltage from said variable voltage means above the diode activating level being connected to said second time constant network to cause it to reach the predetermined threshold level of said second timer means sooner than when the voltage from said variable voltage means is below the diode activating level, diode deactivation causing a pulse widening of the output from said second timer means with advancement of the occurrence of said output pulse.

5. The gating circuit improvement in accordance with claim 4, wherein said rectifier includes a transformer winding connected to the line voltage and two diodes connected to opposite and equal taps about the center of said winding.

6. The gating circuit improvement in accordance with claim 5, wherein said winding is the primary of the reactive ballast connected to the lamp.

7. The gating circuit improvement in accordance with claim 4, wherein said first time constant network includes a trimming resistor.

8. The gating circuit improvement in accordance with claim 4, and including at least one diode connected between the output of said second timer means and the gate of the gated semiconductor.

9. The gating circuit improvement in accordance with claim 4, and including a Zener diode to stabilize the voltage bias applied to said first and second timer means.

10. The gating circuit improvement in accordance with claim 4, wherein said variable voltage means includes a variable resistor voltage divider.

11. A circuit for providing a positionable unipolar dc pulse within a time range of one-half of the line voltage applied to a load, the width of said pulse varying from its widest duration when said pulse is positioned to occur near the beginning of the time range to its narrowest duration when said pulse is positioned to occur near the end of the time range, said improvement comprising
  a rectifier operably connectable to ac line voltage for producing rectified line voltage,
  first timer means having a trigger input actionable when a voltage applied thereto is below a predetermined level for producing a dc pulse output, the duration of which is determined by the length of time that the voltage across a time constant network, discharged prior to application of the trigger input, builds to a predetermined control voltage level, said control voltage internally determining the level at which a threshold input actuates the timing conclusion event of said first timer means, said first timer trigger input being operably connected to said rectified line voltage,
  a first time constant network connected to the threshold input of said first timer means,
  second timer means having a trigger input actionable when a voltage applied thereto is below a predetermined level for producing a dc pulse output, the duration of which is determined by the length of time that the voltage across a time constant network, discharged prior to application of the trigger input, builds to a predetermined control voltage level, said control voltage internally determining the level at which a threshold input actuates the timing conclusion event of said second timing means,
  said second timer input operably being connected to the dc pulse output of said first timer,
  a second time constant network connected to the threshold input of said second timer means,
  variable voltage means connected to change the control voltage level of said first timer means, a change of said first timer control voltage level causing a narrowing of first timer pulse width output, and means connected to said variable voltage means and to said second timer means for causing the timing conclusion event to occur so as to widen the output from said second timer means with advancement of the occurrence of the trailing edge of said dc pulse output of said first timer.

12. A circuit in accordance with claim 11, wherein a lowering of said first timer control voltage causes a narrowing of said first timer pulse output.

13. A circuit for providing a positionable unipolar dc pulse within a time range of one-half of the line voltage applied to a load the width of said pulse varying from its widest duration when said pulse is positioned to occur near the beginning of the time range to its narrowest duration when said pulse is positioned to occur near the end of the time range, said improvement comprising a rectifier operably connectable to ac line voltage for producing rectified line voltage, first timer means having a trigger input actionable when a voltage applied thereto is below a predetermined level for producing a dc pulse output, the duration of which is determined by the length of time that the voltage across a time constant network, discharged prior to application of the trigger input, builds to a predetermined control voltage level, said control voltage internally determining the level at which a threshold input actuates the timing conclusion event of said first timer means, said first timer trigger input being operably connected to said rectified line voltage, a first time constant network connected to the threshold input of said first timer means, second timer means having a trigger input actionable when a voltage applied thereto is below a predetermined level for producing a dc pulse output, the duration of which is determined by the length of time that the voltage across a time constant network, discharged prior to application of the trigger input, builds to a predetermined control voltage level, said control voltage internally determining the level at which a threshold input actuates the timing conclusion event of said second timing means, said second timer input operably being connected to the dc pulse output of said first timer, a second time constant network connected to the threshold input of said second timer means, variable voltage means connected to change the control voltage level of said first timer means, a change of said first timer control voltage level causing a narrowing of first timer pulse width output, and a diode and resistor connected to said variable voltage means and said second time constant network, a voltage from said variable voltage means above the diode activating level being connected to said second time constant network to cause it to reach the predetermined threshold level of said second timer means sooner than when the voltage from said variable voltage means is below the diode activating level, diode deactivation causing a pulse widening of the output from said second timer means with advancement of the occurrence of said output pulse.

14. The gating circuit improvement in accordance with claim 13, wherein said rectifier includes a transformer winding connected to the line voltage and two diodes connected to opposite and equal taps about the center of said winding.

15. The gating circuit improvement in accordance with claim 14, wherein said winding is the primary of the reactive ballast connected to the lamp.

16. The gating circuit improvement in accordance with claim 13, wherein said first time constant network includes a trimming resistor.

17. The gating circuit improvement in accordance with claim 13 and including a Zener diode to stabilize the voltage bias applied to said first and second timer means.

18. The gating circuit improvement in accordance with claim 13, wherein said variable voltage means includes a variable resistor voltage divider.

* * * * *

UNITED STATES PATENT AND TRADEMARK OFFICE
CERTIFICATE OF CORRECTION

PATENT NO. : 4,204,141
DATED : May 20, 1980
INVENTOR(S) : Eric L. H. Nuver

It is certified that error appears in the above-identified patent and that said Letters Patent are hereby corrected as shown below:

Col. 8, line 14, change "HRAI" to --HRAT--.

Signed and Sealed this

Twelfth Day of August 1980

[SEAL]

Attest:

SIDNEY A. DIAMOND

Attesting Officer

Commissioner of Patents and Trademarks